(12) United States Patent
Jung et al.

(10) Patent No.: US 11,502,319 B2
(45) Date of Patent: Nov. 15, 2022

(54) CONTROL METHOD FOR FUEL CELL

(71) Applicants: Hyundai Motor Company, Seoul (KR); KIA Motors Corporation, Seould (KR)

(72) Inventors: Young Woo Jung, Yongin-si (KR); Jung Jae Lee, Gimpo-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 59 days.

(21) Appl. No.: 16/890,099

(22) Filed: Jun. 2, 2020

(65) Prior Publication Data

US 2021/0135257 A1    May 6, 2021

(30) Foreign Application Priority Data

Oct. 31, 2019 (KR) .................. 10-2019-0137462

(51) Int. Cl.
*H01M 8/04537*    (2016.01)
*H01M 8/04858*    (2016.01)
(Continued)

(52) U.S. Cl.
CPC ....... *H01M 8/04559* (2013.01); *B60L 3/0053* (2013.01); *G01R 31/392* (2019.01); *G01R 31/396* (2019.01); *H01M 8/0488* (2013.01); *H01M 8/0491* (2013.01); *H01M 8/04589* (2013.01); *H01M 8/04955* (2013.01); *B60L 2240/421* (2013.01); *H01M 2250/20* (2013.01)

(58) Field of Classification Search
CPC ......... H01M 8/04559; H01M 8/04589; H01M 8/0488; H01M 8/0491; H01M 8/04955; H01M 8/04302; H01M 8/04303; H01M 8/04619; H01M 8/04679; H01M 8/04992
See application file for complete search history.

(56) References Cited

U.S. PATENT DOCUMENTS

2016/0141670 A1\*  5/2016  Maruo ............... H01M 8/0432
                                                   429/450
2016/0144719 A1\*  5/2016  Ryu ...................... B60L 3/0053
                                                   701/22
(Continued)

FOREIGN PATENT DOCUMENTS

KR    10-2018-0117979 A    10/2018

*Primary Examiner* — Stewart A Fraser
*Assistant Examiner* — Brent C Thomas
(74) *Attorney, Agent, or Firm* — McDonnell Boehnen Hulbert & Berghoff LLP

(57) ABSTRACT

The present disclosure relates to a control method for a fuel cell. The control method includes: collecting, by a controller, state information of a fuel cell (FC) stack; determining, by the controller, a degradation state of the FC stack from the collected state information of the FC stack; correcting, by the controller, a basic threshold output corresponding to a present driving state of a vehicle on the basis of information of the determined degradation state of the FC stack; comparing, by the controller, a post-correction threshold output that is obtained by correcting the basic threshold output and a motor demand output, and determining, by the controller, stopping or restarting of a fuel cell; and controlling, by the controller, such that the determined stopping or restarting state of the fuel cell is achieved.

14 Claims, 6 Drawing Sheets

(51) Int. Cl.
*H01M 8/04955* (2016.01)
*G01R 31/392* (2019.01)
*G01R 31/396* (2019.01)
*B60L 3/00* (2019.01)

(56) References Cited

U.S. PATENT DOCUMENTS

2018/0026282 A1* 1/2018 Lee .................. H01M 8/04873
              429/429
2019/0267643 A1* 8/2019 Wang ................ H01M 8/04955

* cited by examiner

CONTROL METHOD FOR FUEL CELL

CROSS REFERENCE TO RELATED APPLICATION

The present application claims priority to Korean Patent Application No. 10-2019-0137462, filed Oct. 31, 2019, the entire contents of which is incorporated herein for all purposes by this reference.

FIELD

The present disclosure relates generally to a control method for a fuel cell and, more particularly, to a control method for a fuel cell. The control method is configured to ensure vehicle starting performance and overtaking performance, to prevent degradation of drive-ability of the vehicle, and to improve system efficiency and fuel efficiency of the fuel cell.

BACKGROUND

Generally, a fuel cell is a generator in which a fuel gas and an oxidant gas react electrochemically and then the chemical energy of a fuel is converted into electricity. The fuel cell is widely used to supply electricity to small electrical/electronic products and portable devices, in addition to being used as industrial, domestic, and automotive power supplies.

As a fuel cell for a vehicle, a polymer electrolyte membrane fuel cell having a high power density has been most studied. The polymer electrolyte membrane fuel cell uses hydrogen as the fuel gas and oxygen or air containing oxygen as the oxidant gas.

The fuel cell may include a plurality of cells generating reaction of the fuel gas and the oxidant gas to generate electrical energy. The plurality of cells is commonly used in a stacked form in which the cells are stacked and then connected in series, in order to meet a required output level.

In the case of the fuel cell mounted to a vehicle, as high output is required in the fuel cell, hundreds of cells that individually generate electrical energy are stacked into the stacked formed to meet the requirement. As described above, a cell assembly in which the plurality of cells are stacked and connected together is called a fuel cell (FC) stack.

As a cell configuration, the polymer electrolyte membrane fuel cell includes: a membrane electrode assembly having catalyst electrode layer attached to both sides of a polymer electrolyte membrane to which hydrogen ions are moved; a gas diffusion layer that supplies a fuel gas and an oxidant gas that are reaction gases to the membrane electrode assembly, and transfers generated electrical energy thereto; and a separating plate that moves the reaction gases and cooling water.

The membrane electrode assembly includes: the polymer electrolyte membrane capable of moving the hydrogen ions; and a cathode and anode, which are electrode layers formed by coating a catalyst on opposite surfaces of the polymer electrolyte membrane to allows hydrogen of the fuel gas and air (or oxygen) of the oxidant gas to react to each other.

In a unit cell of the fuel cell, on exterior portions of the membrane electrode assembly, that is, on exterior portions of the cathode and the anode, the gas diffusion layer for uniformly distributing the fuel gas and the oxidant gas is stacked. On the outside of the gas diffusion layer, the separating plate is positioned to provide a flow path through which the reaction gases and the cooling water pass and to supply the reaction gases to the gas diffusion layer.

Further, a gasket is stacked between components constituting the unit cell for sealing fluid. The gasket may be provided by being molded into a single body with the membrane electrode assembly or the separating plate.

After a plurality of cells is stacked with the cells having the above configuration as the unit cell, an end plate is coupled to an outermost side of the cells to support the cells, and the end plate and the cells are fastened together by a fastening device, thereby forming the FC stack.

A fuel cell system mounted to the fuel cell includes the FC stack and devices for supplying the reaction gases to the FC stack.

That is, the fuel cell system includes: the FC stack generating electrical energy through electrochemical reaction of the reaction gases; a hydrogen supply supplying hydrogen that is the fuel gas to the FC stack; an air supply supplying air containing oxygen that is the oxidant gas to the FC stack; a heat and water management system performing operational temperature control to the FC stack and heat and water management; and a fuel cell control unit (FCU) controlling entire operation of the fuel cell system.

Meanwhile, the endurance life of the FC stack is an important factor for securing marketability of the fuel cell vehicle. Therefore, various techniques have been developed to prevent degradation of the FC stack and increase the endurance life of the FC stack, and causes of stack degradation have been variously founded.

Moreover, in addition to a passenger vehicle, demand for a fuel cell system for a commercial vehicle such as a bus and a truck has grown. By the demand, interest in control technology for improving the endurance life of the fuel cell system has grown.

As the operation time of the FC stack is increased, degradation thereof inevitably occurs, and thus the degradation of the FC stack cannot be completely prevented. However, technology that minimizes the degradation of the FC stack has been actively researched.

When the FC stack is degraded, the vehicle starting performance and overtaking performance may be degraded due to shortage of stack output when the FC stack is restarted. Further, the vehicle drive-ability may be degraded due to jerking motion occurring in the vehicle.

Further, even when the demand output is satisfied when the FC stack in the degradation state is restarted, since an optimum operation point of the FC stack is not considered, operational efficiency and fuel efficiency of the fuel cell system may be lowered.

SUMMARY

Accordingly, the present disclosure has been made keeping in mind the above problems occurring in the related art, and the present disclosure is intended to propose a control method for a fuel cell. The control method is configured to effectively prevent degradation of the vehicle starting performance and overtaking performance due to degradation of the FC stack and degradation of the vehicle drive-ability, and to improve the system efficiency and the fuel efficiency of the fuel cell.

In order to achieve the above object, according to one aspect of the present disclosure, there is provided a control method for a fuel cell, the control method including: collecting, by a controller, state information of a fuel cell (FC) stack; determining, by the controller, a degradation state of the FC stack from the collected state information of the FC stack; correcting, by the controller, a basic threshold output corresponding to a present driving state of a vehicle on the basis of information of the determined degradation state of the FC stack; comparing, by the controller, a post-correction threshold output that is obtained by correcting the basic threshold output and a motor demand output, and determining, by the controller, stopping or restarting of a fuel cell; and controlling, by the controller, such that the determined stopping or restarting state of the fuel cell is achieved.

As described above, the control method for the fuel cell of the present disclosure is configured such that the controller determines the degradation state of the FC stack to control the stopping and restarting of the FC stack according to the degradation state. Thus, the control method of the present disclosure can ensure the vehicle starting performance and overtaking performance, prevent degradation of the vehicle drive-ability, and improve the system efficiency and the fuel efficiency of the fuel cell.

Further, the control method of the present disclosure is configured such that the controller stops or restarts the FC stack at the appropriate time by reflecting the degradation state of the FC stack. Therefore, it is possible to reduce high output use of the FC stack, which delays further degradation.

Further, the control method of the present disclosure is configured to reduce auxiliary machinery consumption energy by reducing operation of an air compressor. Therefore, auxiliary machinery noise can be reduced.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Hereinbelow, an exemplary embodiment of the present disclosure will be described in detail with reference to the accompanying drawings such that the present disclosure can be easily embodied by one of ordinary skill in the art to which the present disclosure belongs. The present disclosure is not limited to the embodiment set forth herein, and can be materialized into other shapes.

Unless the context clearly indicates otherwise, it will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

The present disclosure relates to a control method for a fuel cell. The control method is configured to determine a degradation state of a fuel cell (FC) stack to perform the stopping and restarting control depending on the degradation state. Accordingly, the present disclosure can secure the starting performance and the overtaking performance of a vehicle, prevent degradation of drive-ability of the vehicle, and improve system efficiency and fuel efficiency of the fuel cell.

In order to achieve the above, the control method of the present disclosure is configured to monitor a state (stack state) of the FC stack, to determine the degradation state of the FC stack on the basis of the monitored stack state, and then to perform start and stop control of the FC stack.

Hereinafter, a fuel cell may be understood as the same meaning as a FC stack, and person with ordinary skill in the art may easily understand that driving, stopping, starting (including restart) of the fuel cell mean driving, stopping, starting of a fuel cell system and the FC stack.

Further, unless otherwise defined in the flowing description, an output may mean power P. For example, an output in a motor output, a motor demand output, a battery output, and a FC output may mean power.

Figure 1:
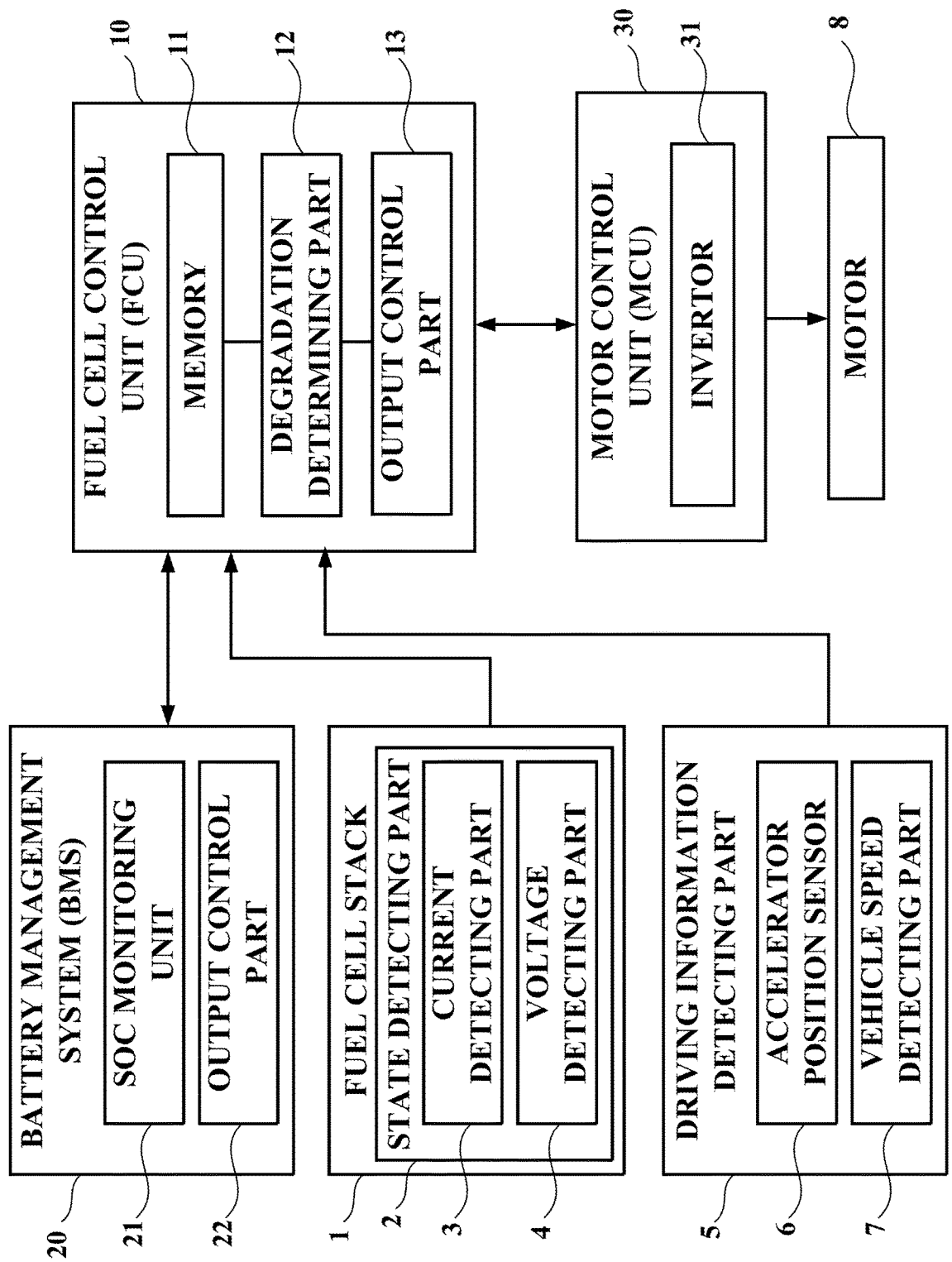
FIG. 1 is a block diagram showing the configuration of a system according to the present disclosure, the system being capable of controlling a fuel cell.

FIG. 1 is a block diagram showing the configuration of a system that is capable of controlling a fuel cell according to the present disclosure. As shown in FIG. 1, a control process of a fuel cell according to the present disclosure may be performed by a controller, more specifically, by a fuel cell control unit (FCU).

The FCU 10 may be configured to receive real-time state information of the FC stack 1 in order to perform fuel cell control according to the present disclosure.

The state information of the FC stack 1 may include a current in the FC stack and a voltage in the FC stack, which are detected with respect to the FC stack.

In order to achieve the above, the FC stack 1 may include a state detecting part 2 for detecting a state of the FC stack, and the state detecting part 2 may include a current detecting part 3 for detecting the current (stack current) in the FC stack, and the voltage detecting part 4 for detecting the voltage (stack voltage) in the FC stack.

The present disclosure is configured such that, the stack current detected by the current detecting part 3 of the FC stack and the stack voltage detected by the voltage detecting part 4 are input to the FCU 10 in real-time.

The FCU 10 performs cooperative control with a battery management system (BMS) 20 and a motor control unit (MCU) 30 for controlling the fuel cell and a motor. Accordingly, the FCU 10 is communicatively connected with the BMS 20 and the MCU 30.

The FCU 10 of the present disclosure includes: a memory 11 storing the state information of the FC stack 1, the state information being detected in real-time by the state detecting part 2; a degradation determining part 12 determining a degradation state of the FC stack 1 on the basis of the state information stored in the memory 11; and an output control part 13 determining the stopping and restarting of the fuel cell with reference to the degradation state of the FC stack 1, the degradation state being determined by the degradation determining part 12, and controlling the driving and output of a motor 8.

The motor 8 is a motor for driving a vehicle, that is, is a drive motor used as a vehicle drive source for driving a vehicle.

The memory 11 of the configuration of the FCU 10 stores data in real-time, the data relating to the stack current I and the stack voltage V detected and input by the current detecting part 3 and the voltage detecting part 4 of the FC stack 1.

Further, the degradation determining part 12 of the FCU 10 determines the degree and state of degradation of the FC stack on the basis of the state information of the FC stack 1, that is, the data of the stack current I and the stack voltage V stored in the memory 11.

The output control part 13 of the FCU 10 determines the stopping and restarting of the fuel cell with consideration for the degradation state of the FC stack. When the fuel cell is stopped depending on the degradation state of the FC stack, the FCU 10 controls the motor 8 to be driven with only power of a battery through the cooperative control with the BMS 20, whereas the vehicle drives in an electric vehicle (EV) mode.

The battery (not shown) is a battery used as a high voltage power supply with the FC stack 1 in a vehicle, and a normal high voltage battery (main battery) mounted in the vehicle. When the FC stack 1 is a main power source (main power source) for driving the motor 8 and operating load in the vehicle, the battery may be an auxiliary power source (auxiliary electricity source).

The battery is provided to store power generated from the FC stack 1 and regenerative power by the motor 8, and is connected to the motor 8 and the load in parallel together with the FC stack 1 in the vehicle.

The battery is a battery supplying operating power required for the motor 8 to drive a vehicle together with the FC stack 1. Although not shown in the drawings, like the FC stack, the battery is provided to apply DC power (charged power) to the motor 8 via an inverter 31.

A normal fuel cell vehicle is provided with the BMS 20, which is configured to collect battery state information and to perform the control for managing the battery state while performing the control for battery charging and discharging (output).

The battery state information may include state of charge (SOC) information that indicates remaining capacity of a high voltage battery with the voltage, the current, and the temperature of the high voltage battery.

Accordingly, the BMS 20 includes a SOC monitoring unit 21 for monitoring and determining the battery SOC and an output control unit 22 for controlling the battery power P.

The output control part 13 of the FCU 10 of the present disclosure is communicatively connected with the output control unit 22 of the BMS 20. The output control part 13 of the FCU 10 and the output control unit 22 of the BMS 20 perform the cooperative control with each other for controlling the battery power P.

The output control part 13 of the FCU 10 determines the stopping or restarting of the fuel cell on the basis of a motor demand output determined from driving information collected from the vehicle, a present vehicle speed detected by a vehicle speed detecting part 7, and degradation state information of the fuel cell. When the output control part 13 determines to stop the fuel cell, the output control part 13 stops the operation of the FC stack 1, and then performs an EV mode control in which the motor 8 is driven with only the battery power.

At this time, the output control part 13 of the FCU 10 performs the cooperative control with the BMS 20 and the MCU 30 for the driving in the EV mode.

On the other hand, when the output control part 13 of the FCU 10 determines the restart of the fuel cell from a stop state, the output control part 13 operates the fuel cell system to restart the operation of the FC stack 1, and then performs a FC mode control in which the motor 8 is driven with only power of the FC stack 1 for the driving of the vehicle.

The output control part 13 of the FCU 10 performs the cooperative control with the MCU 30, so that the vehicle drives such that the motor 8 is driven with only the power of the FC stack 1.

The fuel cell system according to the present disclosure is configured such that, when the motor demand output is determined on the basis of the drive information collected from the vehicle, based on the determined motor demand output, controllers in the vehicle, that is, the FCU 10, the BMS 20, and the MCU 30 perform the cooperative control with each other to drive and control the motor 8 with the power of the FC stack 1 or the battery. There is no difference in that respect in comparison with the related art.

However, the present disclosure has a main feature in monitoring and determining the degree and state of degradation (which may be Pavg, ΔP which will be described later) of the FC stack, and then in determining the stopping and restarting of the fuel cell by reflecting the determined degree and state of degradation of the FC stack.

The present disclosure is configured such that the driving information for determining the motor demand output may be detected by a driving information detecting part 5. The driving information detecting part 5 may include an accelerator position sensor (APS) 6.

A process or a method for detecting the driving information that is collected from the vehicle for determining the motor demand output, and for determining the motor demand output from the driving information are known to those skilled in the art, so detailed descriptions thereof will be omitted in the specification.

However, for example, the driving information may include information depending on a driver's accelerator pedal operation state, that is, a driver's accelerator pedal input information. The driver's accelerator pedal input may be an accelerator pedal position, which may be detected by the APS 6.

Hereinafter, a method for calculating a fuel cell control factor ΔP depending on the degradation state of the FC stack 1 by the degradation determining part 12 of the FCU 10 will be described.

Figure 2:
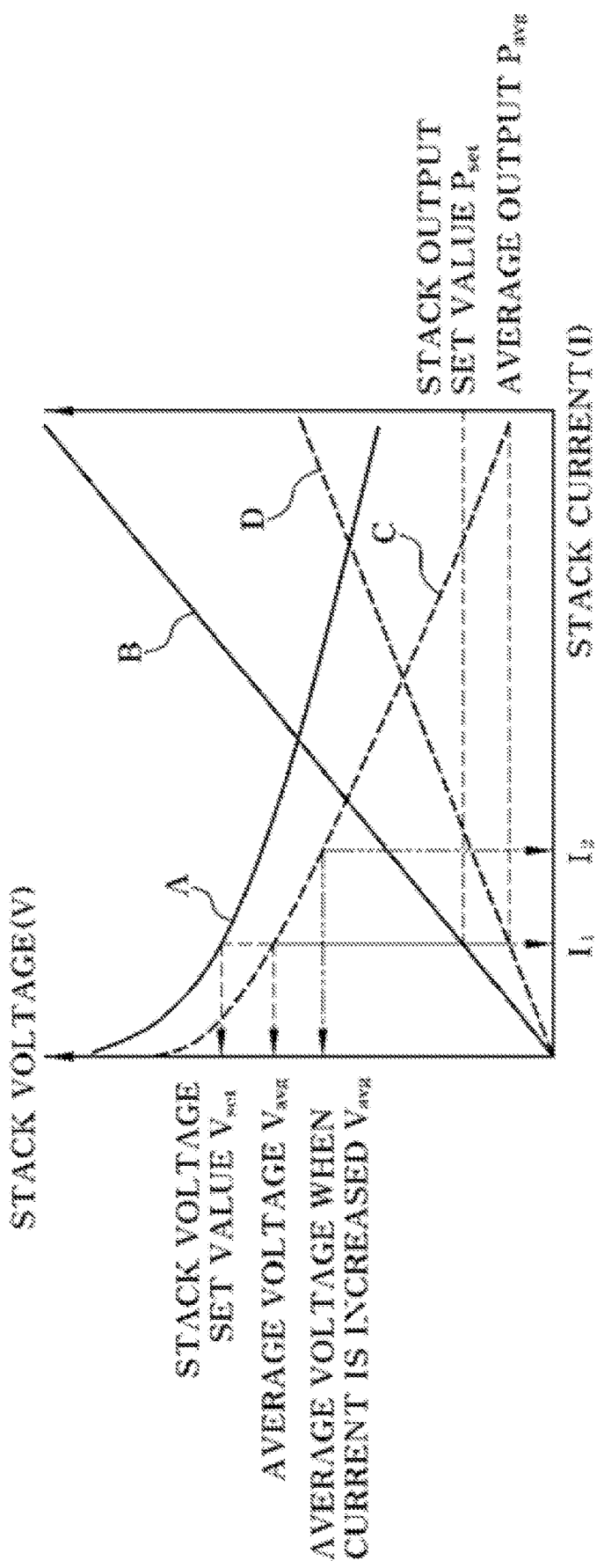
FIG. 2 is a graph showing the relation between a stack current, a stack voltage, and a stack output in the present disclosure.

FIG. 2 is a graph showing the relation between the stack current I, the stack voltage V, and the stack output P in the present disclosure. Line 'A' and line 'B' indicate a stack set value according to a current, and line C and line D indicate a present degree and state of stack degradation.

As shown in FIG. 2, a horizontal axis is the stack current I, and left and right vertical axes are the stack voltage V and the stack output P, respectively.

Further, in FIG. 2, line 'A' is a set voltage line indicating a stack voltage set value (Vset) according to the stack current I, and line 'B' is a set power line indicating a stack output set value (Pset) according to the stack current I.

The stack output set value (Pset) is calculated by multiplying the stack voltage set value (Vset) for each current value I by each current value I in the entire stack current region (that is, Pset=Vset×I).

It may be understood that the stack voltage set value (Vset) and the stack output set value (Pset) are a voltage and an output according to a current of an initial stack that is not degraded.

Lines 'C' and 'D' indicate a state of an actual FC stack in the vehicle to be controlled. The state of the actual FC stack may mean average stack performance, so line 'C' is a line of an average voltage of the actual FC stack, and line 'D' is a line of an average output of the actual FC stack.

Lines 'C' and 'D' vary depending on the state of the actual FC stack, especially, the degree and state of actual stack degradation. Line 'C' indicates an actual average stack voltage (Vavg) according to a current, and line 'D' indicates an actual average stack output (Pavg) according to the current.

In FIG. 2, line 'C' may be drawn by calculating the average voltage (Vavg) per current, and line 'D' may be drawn by calculating the average output (Pavg) per current.

In the present disclosure, the difference between the stack output set value (Pset) and the average output (Pavg) per current according to the stack current is defined as the fuel cell control factor ΔP (ΔP=Pset−Pavg). As the average output (Pavg) per current varies depending on the actual state of stack degradation, ΔP also varies.

At this point, ΔP is, in a broad sense, a difference value between the stack average performance value and the preset stack set value. In detail, ΔP is a value defined as the difference between the stack output set value (Pset) and the average output (Pavg) per current which correspond to the same current.

In the present disclosure, the average voltage (Vavg) per current and the average output (Pavg) per current that are the average stack performance are factors that indicate the state of stack degradation. Further, ΔP that is the control factor defined as the output difference (Pset−Pavg) according to a current is also a factor indicating the state of stack degradation, that is, a degradation state value of the FC stack.

The present disclosure is configured such that, the control factor ΔP is determined by the degradation determining part 12 of the FCU 10, and the degradation determining part 12 determines a value of ΔP indicating the degree and state of stack degradation by using the data of the stack current I and the stack voltage V stored in the memory 11 of the FCU 10.

The process is as follows. The degradation determining part 12 of the FCU 10 calculates the average voltage (Vavg) of the FC stack 1. In detail, the degradation determining part 12 of the FCU 10 calculates the actual average voltage (Vavg) of the FC stack by using the data of the stack current I and the stack voltage V detected by the current detecting part 3 and the voltage detecting part 4 and then stored in the memory 11.

As described above, when the stack current I and the stack voltage V that are detected by the current detecting part 3 and the voltage detecting part 4 of the FC stack 1, are respectively input to the FCU 10 in real-time, the input stack current I and the input stack voltage V are stored in the memory 11 of the FCU 10 in real-time. Simultaneously, the degradation determining part 12 of the FCU 10 calculates the average voltage (Vavg) and the average output (Pavg) in real-time by further using the stack current I and the stack voltage V that are newly stored.

The average voltage (Vavg) is an average value of the stack voltage V stored in the memory 11, the stack voltage V being accumulated for each current.

Further, the average output (Pavg) is calculated by multiplying the average voltage (Vavg) per each current by each current value (I) (Pavg=Vavg×I). Both the average voltage (Vavg) and the average output (Pavg) vary depending on the present degradation state of the FC stack, and may be a value indicating the present degree and state of degradation of the FC stack.

As described above, ΔP (ΔP=Pset−Pavg) that is the difference value between the stack output set value (Pavg) and the average output (Pavg) is also a value indicating the present degree and state of degradation of the FC stack.

That is, when the ΔP value is 0, no degradation has occurred, and as the ΔP value is increased, the degradation has progressed.

Figure 3:
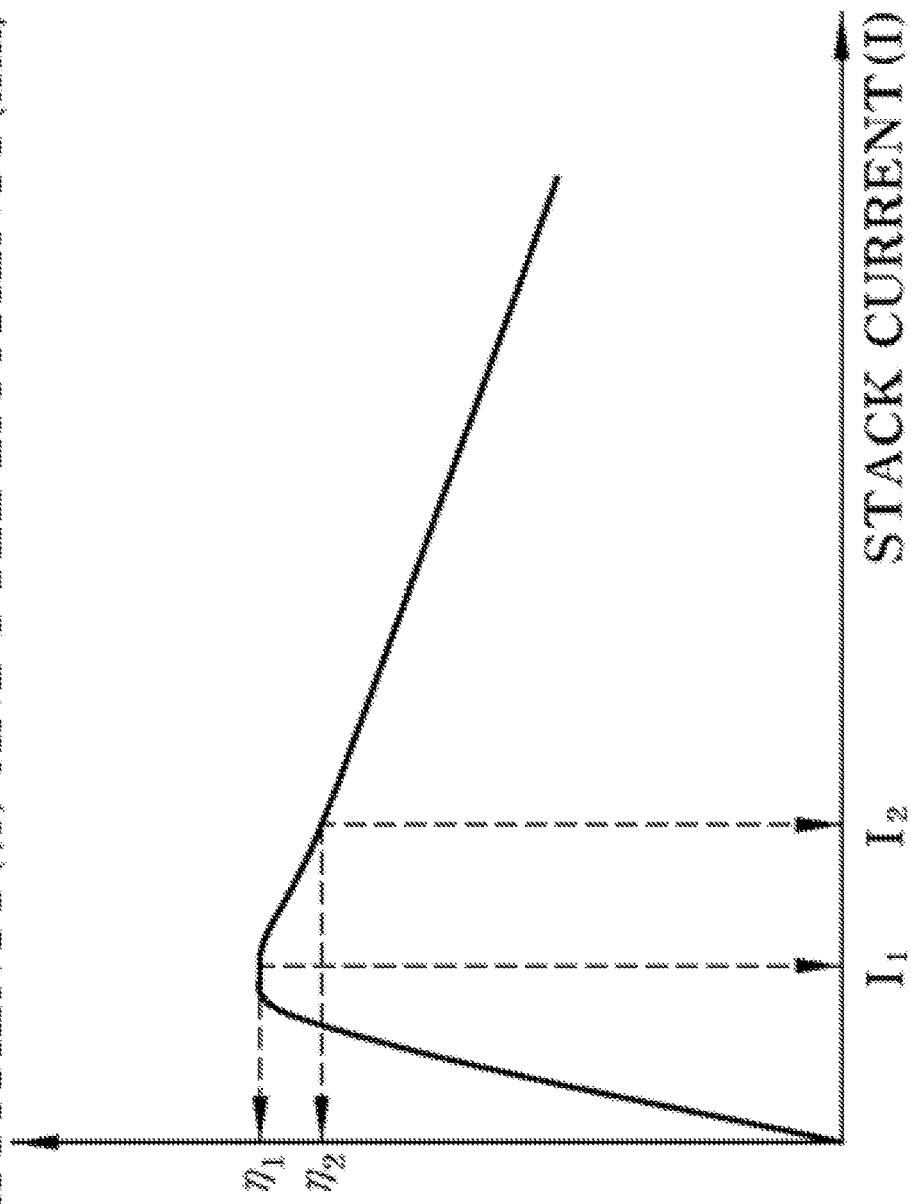
FIG. 3 is a graph showing a state in which as a current in a fuel cell stack is increased, system efficiency or fuel efficiency of the fuel cell system is gradually reduced.

FIG. 3 is a graph showing a state in which as a current in the FC stack is gradually increased above a predetermined level, the system efficiency or the fuel efficiency of the fuel cell system is gradually reduced.

Figure 4:
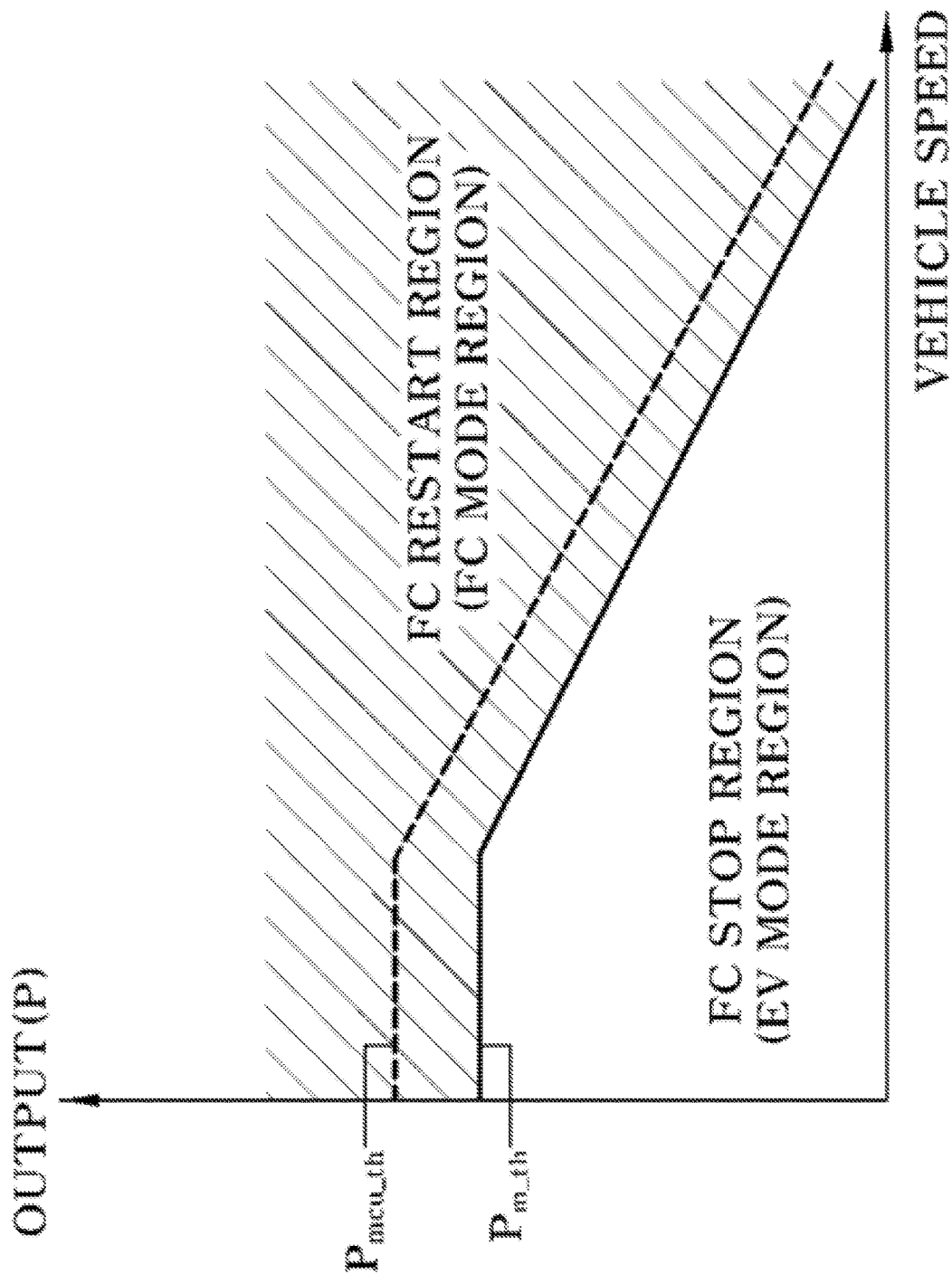
FIG. 4 is a graph showing an ordinary map for determining the stopping or restarting of the fuel cell.

FIG. 4 is a graph showing a map for determining the stopping or restarting of the fuel cell in the normal fuel cell vehicle.

As shown in FIG. 4, the normal fuel cell vehicle is configured such that a map in which a vehicle driving state, for example, a value according to the vehicle speed (km/h) is set as a threshold output is input and stored in the FCU 10 to be used to determine the stopping and restarting of the fuel cell.

Referring to FIG. 4, a region where the motor demand output (Pm, Pmcu) is equal to or higher than the threshold output (Pm_th, Pmcu_th) is set as a fuel cell restart region, that is, as a FC mode region. Further, a region where the motor demand output is less than the threshold output is set as a fuel cell stop region, that is, as an EV mode region.

When the motor demand output is determined from the driving information collected from the vehicle during driving, the stop or the restarting of the fuel cell is determined by using the map in FIG. 4 from a present motor demand output and vehicle speed information.

That is, when the threshold output corresponding to a present vehicle speed is determined from the map, the fuel cell is stopped when the present motor demand output is less than the threshold output, and the fuel cell is restarted when the present motor demand output is equal to or higher than the threshold output.

Hereinabove, the motor demand output and the threshold output have been described by comparison to each other. The motor demand output may be an output in the MCU 30, that is, a MCU demand output (Pmcu), or may be a demand output based on a motor, that is, a motor-based demand output (Pm).

The motor-based demand output (Pm) is an output that is required for driving a vehicle on the basis of a motor. The MCU demand output (Pmcu) is a demand output considering energy transfer efficiency (α, α<1) of a motor or a reducer. The relation between the motor-based demand output (Pm) and the MCU demand output (Pmcu) is shown in equation (1) below.

$$Pm = Pmcu \times \alpha \quad (1)$$

Therefore, when the motor-based demand output (Pm) is used as the motor demand output in order to determine the stopping or restarting of the fuel cell, a motor threshold output (Pm_th) that is a value according to the vehicle speed (km/h) should be preset in the map as the threshold output.

Accordingly, when the motor-based demand output (Pm) is determined from the driving information during driving, the FCU 10 determines the stopping or restarting of the fuel cell by comparing the motor-based demand output (Pm) with the motor threshold output (Pm_th) corresponding to the present vehicle speed on the map.

When the motor-based demand output (Pm) is equal to or higher than the motor threshold output (Pm_th) determined from the map (Pm≥Pm_th), the FCU 10 controls to maintain the fuel cell in the operation state (start state), or to restart the fuel cell, so that the vehicle drives in the FC mode.

On the other hand, the motor-based demand output (Pm) is less than the motor threshold output (Pm_th) (Pm<Pm_th), the FCU 10 controls to maintain the stop state of the fuel cell, or to stop the fuel cell from the operation state (start state), so that the vehicle drives in the EV mode.

When the MCU demand output (Pmcu) is used as the motor demand output in order to determine the stopping or restarting of the fuel cell, the MCU threshold output (Pmcu_th) is set in the map as a value according to the vehicle speed (km/h).

In this case, when the MCU demand output (Pmcu) is equal to or higher than the MCU threshold output (Pmcu_th) (Pmcu≥Pmcu_th), the FCU 10 controls to maintain the operation state (start state) of the fuel cell, or to restart the fuel cell, so that the vehicle drives in the FC mode. On the contrary, when the MCU demand output (Pmcu) is less than the MCU threshold output (Pmcu_th) (Pmcu<Pmcu_th), the FCU 10 controls to maintain the stop state of the fuel cell, or to stop the fuel cell, so that the vehicle drives in the EV mode.

As described above, in the EV mode, the vehicle drives by driving the motor 8 with power of the high voltage battery, and in the FC mode, considering operation time of a compressor that supplies air to the FC stack, the vehicle drives such that the motor 8 is driven with power of the FC stack after the high voltage battery generates power.

The present disclosure is configured to use a conventional threshold output that does not consider the degradation state of the FC stack. However, the conventional threshold output is not used as it is, but the conventional threshold output is used after correction of the threshold output by using the value of ΔP indicating the degradation state.

A threshold output without consideration of the degradation state, that is, a pre-correction threshold output (that is, a basic threshold output which will be described later) is used by performing a preliminary test on an initial FC stack of the same specification in which no degradation occurs and then setting and tuning the threshold output with a value according to the vehicle speed.

Hereinafter, in the specification, the threshold output that is set as a value of a FC stack in which no degradation occurs as described above will be referred to as a basic threshold output a basic threshold output. As an embodiment, when the use of the basic threshold output is classified in detail, an existing motor threshold output is referred to a basic motor threshold output (Pm_th_b), and a MCU threshold output is referred to a basic MCU threshold output (Pmcu_th_b).

When the FC stack is degraded, as the output of the FC stack is insufficient, vehicle acceleration performance is deteriorated. When air supply is increased to meet a required stack output, compressor consumption energy is increased and the stack current is increased to change a stack current operation point, as shown in FIG. 3, so that system efficiency and fuel efficiency of the fuel cell is deteriorated.

Therefore, it is necessary to determine the stopping or restarting of the fuel cell in consideration of the degradation state of the FC stack. Further, in the present disclosure, when the stopping or restarting of the fuel cell is determined, ΔP (ΔP=Pset−Pavg) indicating the degree and state of degradation of the FC stack is used.

That is, as described above, when the degradation determining part 12 of the FCU 10 determines ΔP indicating the degree and state of degradation of the FC stack, a value of ΔP is input to the output control part 13 of the FCU 10. Then, the output control part 13 corrects the basic threshold output corresponding to the present vehicle speed by adding the value of ΔP (positive value) corresponding to a present stack current.

As a result, the output control part 13 of the FCU 10 compares the threshold output that is corrected by adding the value of ΔP corresponding to a present stack current to the basic threshold output, that is, a post-correction threshold output with the present motor demand output. Further, when the motor demand output is equal to or higher than a post-correction threshold output of the same vehicle speed, the FCU 10 controls to maintain the operation state (start state) of the fuel cell or to restart the FC cell from the stop state, so that the vehicle drives in the FC mode.

However, when the motor demand output is less than the post-correction threshold output of the same vehicle speed, the FCU 10 controls to maintain the stop state of the fuel cell or to stop the fuel cell from the operation state (start state), so that the vehicle drives in the EV mode.

As described above, correction of the threshold output by adding ΔP of the positive value to the basic threshold output (pre-correction threshold output) is to increase the threshold output by ΔP even under the same vehicle speed, so which means the expansion of the fuel cell stop region (EV mode region).

At this point, as the degree of degradation of the FC stack 1 is larger, ΔP (ΔP=Pset−Pavg) in FIG. 2 is larger, eventually, the post-correction threshold output is relatively larger under the same vehicle speed as the degree of degradation of the FC stack 1 is larger. Thus, the fuel cell stop region will be further expanded.

Figure 5:
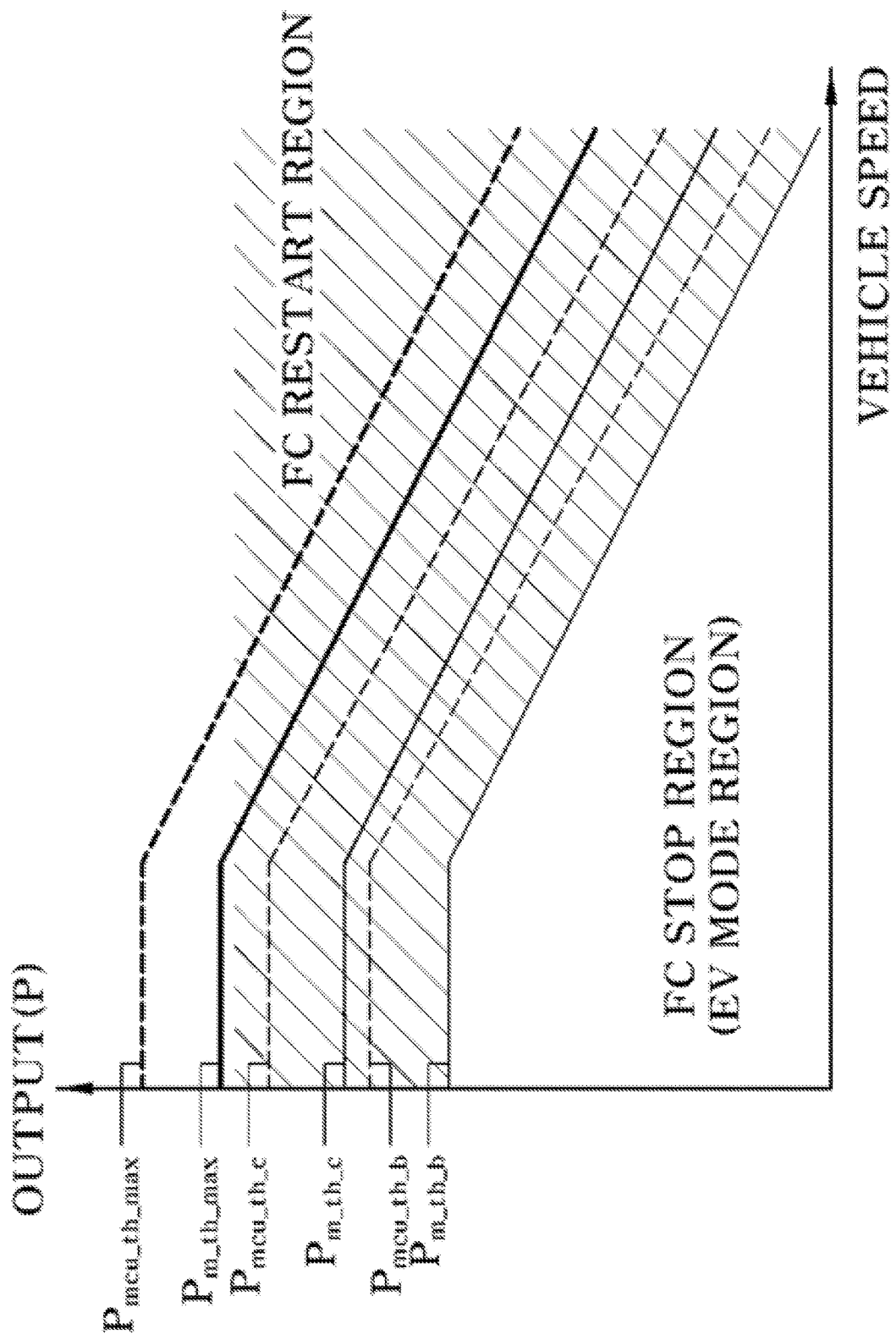
FIG. 5 is a graph showing an ordinary map for determining the stopping or restarting of the fuel cell in the present disclosure.

FIG. 5 is a graph showing an ordinary map for determining the stopping or restarting of the fuel cell in the present disclosure.

Referring to FIG. 5, as the basic threshold output, a basic motor threshold output (Pm_th_b) and a basic MCU threshold output (Pmcu_th_b) are shown. Further, a post-correction motor threshold output (Pm_th_c) obtained by adding the value of ΔP corresponding to the present stack current to the basic motor threshold output (Pm_th_b), and a post-correction MCU threshold output (Pmcu_th_c) obtained by adding the value of ΔP corresponding to the present stack current to the basic MCU threshold output (Pmcu_th_b) are shown.

When the basic motor threshold output (Pm_th_b) is used as the basic threshold output, the post-correction motor threshold output (Pm_th_c, Pm_th_c=Pm_th_b+ΔP) that is obtained by adding the value of ΔP corresponding to the present stack current to the basic motor threshold output (Pm_th_b) is used. Ultimately, when the motor-based demand output (Pm) is compared with the post-correction motor threshold output (Pm_th_c) and is equal to or higher than the post-correction motor threshold output (Pm_th_c) (Pm≥Pm_th_c), the vehicle is controlled to drive in the FC mode, but when the motor-based demand output (Pm) is less than the post-correction motor threshold output (Pm_th_c) (Pm<Pm_th_c), the vehicle is controlled to drive in the EV mode.

Further, when the basic MCU threshold output (Pmcu_th_b) is used as the basic threshold output, the post-correction MCU threshold output (Pmcu_th_c, Pmcu_th_c=Pmcu_th_b+ΔP) that is obtained by adding the value of ΔP corresponding to present stack current to the basic MCU threshold output (Pmcu_th_b) is used. Ultimately, when the MCU demand output (Pmcu) is compared with the post-correction MCU threshold output (Pmcu_th_c), and when the MCU demand output (Pmcu) is equal to or higher than with the post-correction MCU threshold output (Pmcu_th_c) (Pmcu≥Pmcu_th_c), the vehicle is controlled to drive in the FC mode, but when the MCU demand output (Pmcu) is less than with the post-correction MCU threshold output (Pmcu_th_c) (Pmcu<Pmcu_th_c), the vehicle is controlled to drive in the EV mode.

However, when it is difficult to apply the value of ΔP according to stack degradation, that is, in comparison for a case in which the motor demand output is not satisfied by power of the high voltage battery, a maximum value of post-correction threshold output for determining the stopping or restarting of the fuel cell is set separately.

In detail, when the post-correction threshold output obtained by adding the value of ΔP corresponding to present stack current to the basic threshold output is equal to or higher than the maximum value, that is, the maximum value of threshold output, the stopping or restarting of the fuel cell is determined by using the maximum value of threshold output.

That is, the stopping or restarting of the fuel cell is determined by comparing the preset maximum value of threshold output with the motor demand output.

When the motor demand output is equal to or higher than the maximum value of threshold output, the vehicle is controlled to drive in the FC mode. When the motor demand output is less than the maximum value of threshold output, the vehicle is controlled to drive in the EV.

Thus, the post-correction threshold output may be limited not to be larger than the maximum value of threshold output.

The present disclosure is configured such that the maximum value of threshold output is a value according to the vehicle speed and is set in the output control part 13 of the FCU 10 in advance, and a maximum value of threshold output corresponding to present vehicle value is selected from the output control part 13 of the FCU 10 to be used to determine the stopping or restarting of the fuel cell.

In the above description, specifically, the motor demand output may be the motor-based demand output (Pm) or the MCU demand output (Pmcu), and the maximum value of threshold output may be the maximum value of motor threshold output (Pm_th_max) or the maximum value of MCU threshold output (Pmcu_th_max).

Referring to FIG. 5, as the maximum value of threshold output, the maximum value of motor threshold output (Pm_th_max) and the maximum value of MCU threshold output (Pmcu_th_max) are set according to the vehicle speed (km/h). Further, one of the maximum value of motor threshold output (Pm_th_max) and the maximum value of MCU threshold output (Pmcu_th_max) may be used therefor.

Accordingly, when the post-correction motor threshold output (Pm_th_c) is equal to or higher than the maximum value of motor threshold output (Pm_th_max) (Pm_th_c≥Pm_th_max), the stopping or restarting of the fuel cell is determined by comparing the motor-based demand output (Pm) with the maximum value of motor threshold output (Pm_th_max).

On the other hand, when the post-correction MCU threshold output (Pmcu_th_c) is equal to or higher than the maximum value of MCU threshold output (Pmcu_th_max) (Pmcu_th_c≥Pmcu_th_max), the stopping or restarting of the fuel cell is determined by comparing the MCU demand output (Pmcu) with the maximum value of MCU threshold output (Pmcu_th_max).

Figure 6:
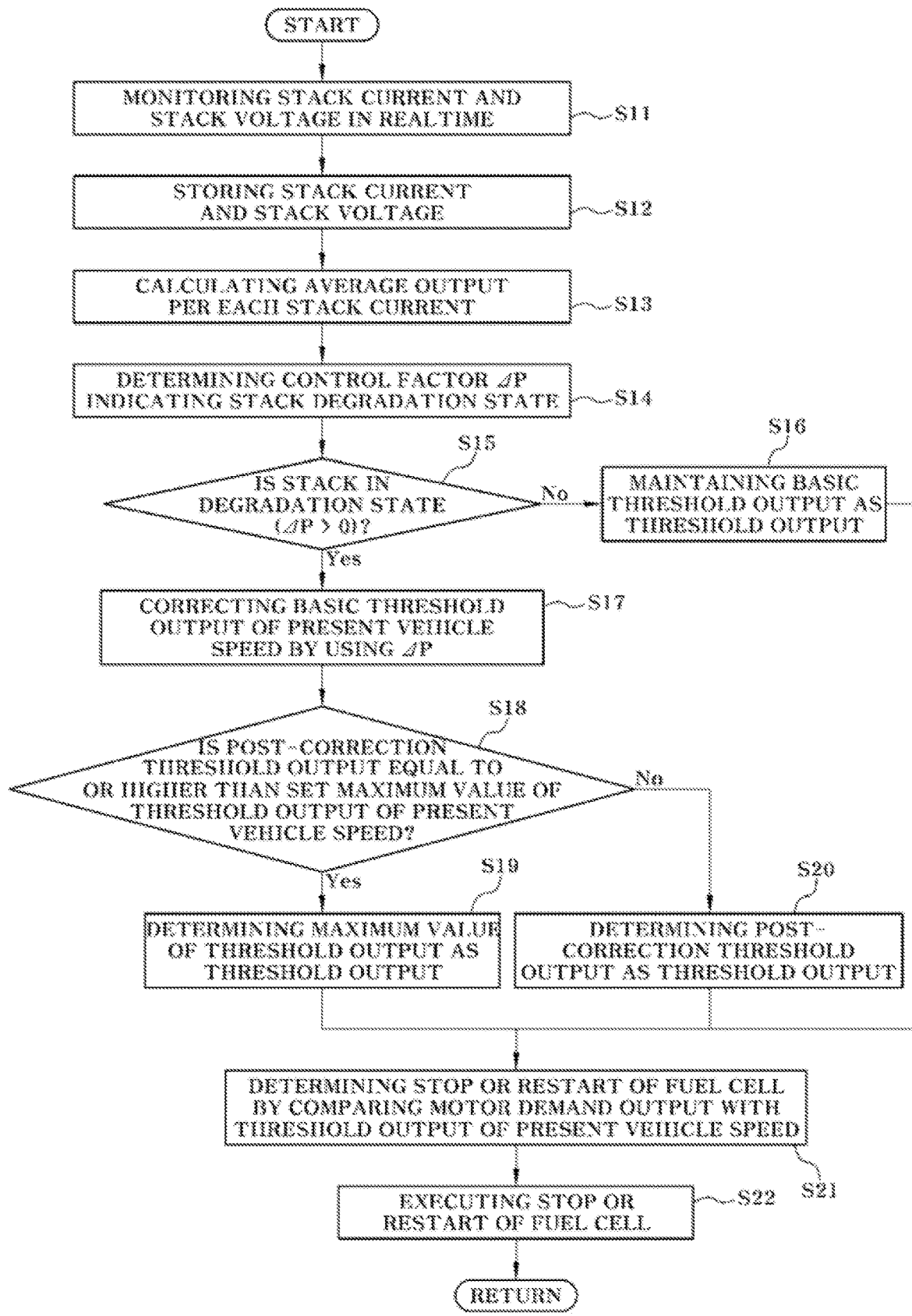
FIG. 6 is a flowchart showing a control method for a fuel cell according to the present disclosure.

FIG. 6 is a flowchart showing a control method for a fuel cell according to the present disclosure, and the control process described above is shown as the flowchart.

Referring to FIG. 6, in a fuel cell system of a vehicle to be controlled, a stack current I and a stack voltage V are monitored and detected in real-time by the current detecting part 3 and the voltage detecting part 4 S11. The detected stack current I and the detected stack voltage V are input and stored in real-time in the memory 11 of the FCU 10 S12.

Further, the degradation determining part 12 of the FCU 10 calculates the average stack output (Pavg) for each stack current in real-time by using the stack current I and the stack voltage V stored in the memory 11 S13.

Then, for determining degradation state, the degradation determining part 12 of the FCU 10 determines the control factor ΔP indicating stack degradation state by using the data of the stack output set value (Pset) set for each stack current S14.

The ΔP that is the difference between the stack output set value (Pset) corresponding to present stack current which is detected by the current detecting part 3 and the average output (Pavg) corresponding to the present stack current.

Then, the output control part 13 of the FCU 10 receives the value of ΔP that is the determined difference of output from the degradation determining part 12, and then determines the degradation state of the FC stack from the value of ΔP S15.

At this point, the output control part 13 of the FCU 10 determines that the stack degradation has occurred when the value of ΔP is higher than 0.

On the other hand, the FCU 10 (output control part) determines that the stack degradation does not occur when the value of ΔP is 0. When stack degradation does not occur, the output control part 13 of the FCU 10 maintains the basic threshold output as the threshold output for determining the stopping or restarting of the fuel cell S16.

The basic threshold output corresponding to the present vehicle speed is compared with the motor demand output to determine the stopping or restarting of the fuel cell S21. Thereafter, the fuel cell is stopped or restarted under the cooperative control between the controllers S22.

In S21, the FCU 10 (output control part) uses the basic threshold output by determining from the map, the basic threshold output corresponding to the present vehicle speed being detected by the vehicle speed detecting part 7.

In S21, when the motor demand output is compared with the basic threshold output, and is equal to or higher than the basic threshold output, the fuel cell is controlled to be maintained in the operation state (start state) or is restarted from the stop state, and then the vehicle is controlled to drive in the FC mode in which the motor 8 is driven with power of the fuel cell.

On the other hand, when the motor demand output is less than the basic threshold output, the fuel cell is controlled to be maintained in the stop state or is stopped from the operation state (start state), and then the vehicle is controlled to drive in the EV mode in which the motor 8 is driven with power of the battery.

At this point, the motor demand output may be the MCU demand output (Pmcu) or motor-based demand output (Pm, Pm=Pmcu×α). Further, the basic threshold output for determining the stopping or restarting of the fuel cell may be the basic MCU threshold output (Pmcu_th_b) or the basic motor threshold output (Pm_th_b, Pm_th_b=Pmcu_th_b×α).

Meanwhile, the output control part 13 of the FCU 10 determines that the stack degradation occurs when the value of ΔP is higher than 0 in S15. Therefore, the output control part 13 corrects the threshold output for determining the stopping or restarting by adding the value of ΔP corresponding to the present stack current to the basic threshold output corresponding to the vehicle speed S17.

Further, the output control part 13 of the FCU 10 compares the post-correction threshold output with the maximum value of threshold output corresponding to the present vehicle speed S18. When the post-correction threshold output is less than the maximum value of threshold output, the output control part 13 determines the stopping or restarting of the fuel cell by using the post-correction threshold output S20 and S21.

That is, the output control part 13 of the FCU 10 compares the motor demand output with the post-correction threshold output. When the motor demand output is equal to or higher than the post-correction threshold output, the output control part 13 controls to maintain the operation state (start state) of the fuel cell or to restart the fuel cell from the stop state. Therefore, the output control part 13 controls the vehicle to drive in the FC mode in which the motor 8 is driven with power of the fuel cell S22.

On the other hand, when the motor demand output is less than the post-correction threshold output, the output control part 13 of the FCU 10 controls to maintain the stop state of the fuel cell or to stop the fuel cell from the operation state (start state), and then controls the vehicle to drive in the EV mode in which the motor 8 is driven with power of the battery.

As described above, the maximum value of threshold output may be the maximum value of motor threshold output (Pm_th_max) or the maximum value of MCU threshold output (Pmcu_th_max). The maximum value of motor threshold output (Pm_th_max) may be set as a value (Pm_th_max=Pmcu_th_max×α) that is obtained by multiplying energy transfer efficiency (α) of the motor or the reducer by the maximum value of MCU threshold output (Pmcu_th_max) of the same vehicle speed.

Further, the motor demand output may be the MCU demand output (Pmcu) or the motor-based demand output (Pm, Pm=Pmcu×α). Further, the post-correction threshold output for determining the stopping or restarting may be the post-correction MCU threshold output (Pmcu_th_c) that is obtained by adding the value of ΔP corresponding to the present stack current to the basic MCU threshold output (Pmcu_th_b) or the post-correction motor threshold output (Pm_th_c) that is obtained by adding the value of ΔP corresponding to present stack current to the basic motor threshold output (Pm_th_b).

The post-correction motor threshold output (Pm_th_c) may be calculated by multiplying the energy transfer efficiency (α) of the motor or the reducer by the post-correction MCU threshold output (Pmcu_th_c) (Pm_th_c=Pmcu_th_c×α).

Meanwhile, in S18, when the post-correction threshold output is equal to or higher than the maximum value of threshold output, the stopping or restarting of the fuel cell is determined by using the maximum value of threshold output S19 and S21. When the motor demand output is equal to or higher than the maximum value of threshold output, the fuel cell is controlled to be maintained in the operation state (start state) or to be restarted from the stop state, and then the vehicle is controlled to drive in the FC mode in which the motor 8 is driven with power of the fuel cell S22.

On the contrary, when the motor demand output is less than the maximum value of threshold output, the fuel cell is controlled to be maintained in the stop state or to be stopped from the operation state (start state), and then the vehicle is controlled to drive in the EV mode in which the motor 8 is driven with power of the battery.

According to the control method for the fuel cell of the present disclosure, the control method is configured to determine degradation state of the FC stack to control the stopping or restarting of the FC stack according to the degradation state thereof. Thus, the present disclosure can secure the starting performance and the overtaking performance of the vehicle, prevent degradation of drive-ability of the vehicle, and improve system efficiency and fuel efficiency of the fuel cell.

Further, the control method for the fuel cell of the present disclosure is configured such that the FC stack is stopped or restarted at the appropriate time by reflecting the degradation state of the FC stack. Thus, the high output usage of the FC stack can be reduced, which can delay further degradation.

Further, the control method for the fuel cell of the present disclosure is configured such that auxiliary machinery consumption energy can be reduced by reducing operation of an air compressor, and auxiliary machinery noise can be reduced.

Although the preferred embodiment of the present disclosure has been described for illustrative purposes, those skilled in the art will appreciate that various modifications, additions and substitutions are possible, without departing from the scope and spirit of the disclosure as provided in the accompanying claims.

The invention claimed is:

1. A control method for a fuel cell, the method comprising:
   collecting, by a controller, state information of a fuel cell (FC) stack;
   determining, by the controller, a degradation state of the FC stack from the collected state information of the FC stack;
   obtaining, by the controller, a basic threshold output corresponding to a present driving state of a vehicle, the basic threshold output being a predetermined output when there is no degradation in the FC stack;
   correcting, by the controller, the basic threshold output based on the determined degradation state of the FC stack to obtain a post-correction threshold output;
   comparing, by the controller, the post-correction threshold output with a motor demand output;
   determining, by the controller, stopping or restarting of a fuel cell based on the comparison between the post-correction threshold output and the motor demand output; and
   controlling, by the controller, such that the determined stopping or restarting state of the fuel cell is achieved,
   wherein the determining the degradation state of the FC stack by the controller comprises:
     obtaining an average performance value of the FC stack from the collected state information of the FC stack; and
     determining a degradation state value of the FC stack from a difference value between the obtained average performance value of the FC stack and a preset set value of the FC stack,
     wherein, in the correcting the basic threshold output by the controller, the post-correction threshold output is obtained by adding the determined degradation state value of the FC stack to the basic threshold output corresponding to the present driving state of the vehicle.

2. The control method of claim 1, wherein the state information of the FC stack includes a stack current and a stack voltage.

3. The control method of claim 2, wherein the determining the degradation state of the FC stack by the controller comprises:
- calculating and storing an average voltage that is an average value of stack voltage for each stack current from data of the stack current and the stack voltage detected with respect to the FC stack;
- calculating average output for each stack current from the average value of the stack voltage for each stack current, and storing the average output; and
- determining a degradation state value of the FC stack from both the average output for each stack current and a preset set value of a stack output for each stack current.

4. The control method of claim 3, wherein, in the determining the degradation state of the FC stack, a value of $\Delta P$ is determined as the degradation state value of the FC stack, the value of $\Delta P$ being calculated by a difference between the preset set value of the stack output corresponding to a present stack current and the average output corresponding to the present stack current.

5. The control method of claim 4, wherein, in the correcting the basic threshold output by the controller, the post-correction threshold output is obtained by adding the calculated value of $\Delta P$ to the basic threshold output corresponding to the present driving state of the vehicle.

6. The control method of claim 1, wherein the average performance value of the FC stack is an average output that is an average value of a stack output for each stack current.

7. The control method of claim 1, wherein the driving state of the vehicle includes a vehicle speed.

8. The control method of claim 1, wherein, in the determining the stopping or restarting of the fuel cell by the controller, when the motor demand output is equal or higher than the post-correction threshold output, the controller determines to restart the fuel cell.

9. The control method of claim 1, wherein, in the determining the stopping or restarting of the fuel cell by the controller, when the motor demand output is less than the post-correction threshold output, the controller determines to stop the fuel cell.

10. The control method of claim 1, wherein, in the determining the stopping or restarting of the fuel cell by the controller, when the post-correction threshold output is equal to or higher than a preset maximum value of threshold output corresponding to the present driving state of the vehicle, the controller determines the stopping or restarting of the fuel cell by comparing the motor demand output with the maximum value of threshold output.

11. The control method of claim 1, wherein, in the determining the stopping or restarting of the fuel cell by the controller, when the post-correction threshold output is less than a preset maximum value of threshold output corresponding to the present driving state of the vehicle, the controller determines the stopping or restarting of the fuel cell by comparing the motor demand output with the post-correction threshold output.

12. The control method of claim 1, wherein, when the controller determines that degradation of the FC stack does not occur from the determined degradation state of the FC stack, the control method further comprises:
- determining the stopping or restarting of the fuel cell by comparing the basic threshold output corresponding to the present driving state of the vehicle with the motor demand output.

13. The control method of claim 12, wherein, when the motor demand output is equal to or higher than the basic threshold output, the controller determines to restart the fuel cell.

14. The control method of claim 12, wherein, when the motor demand output is less than the basic threshold output, the controller determines to stop the fuel cell.

* * * * *